(12) United States Patent
Ouchi et al.

(10) Patent No.: US 6,771,145 B2
(45) Date of Patent: Aug. 3, 2004

(54) SURFACE ACOUSTIC WAVE DEVICE

(75) Inventors: Minefumi Ouchi, Ishikawa-ken (JP); Masaru Yata, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/230,038

(22) Filed: Aug. 29, 2002

(65) Prior Publication Data

US 2003/0062970 A1 Apr. 3, 2003

(30) Foreign Application Priority Data

Aug. 29, 2001 (JP) ........................................ 2001-260152
Feb. 28, 2002 (JP) ........................................ 2002-053942

(51) Int. Cl.[7] ................................................ H03H 9/00
(52) U.S. Cl. ................... 333/195; 333/193; 310/313 R; 310/313 B
(58) Field of Search ................................ 333/195, 193, 333/133; 310/313 D, 313 R, 313 A, 313 B, 313 C

(56) References Cited

U.S. PATENT DOCUMENTS

2001/0013815 A1 * 8/2001 Sawada ...................... 333/133
2002/0021195 A1 * 2/2002 Takamine ................... 333/195

FOREIGN PATENT DOCUMENTS

JP        06-177697        6/1994

* cited by examiner

*Primary Examiner*—Brian Young
*Assistant Examiner*—John B Nguyen
(74) *Attorney, Agent, or Firm*—Keating & Bennett, LLP

(57) ABSTRACT

A longitudinally coupled resonator type surface acoustic wave element including three interdigital electrode portions is disposed on a piezoelectric substrate. The surface acoustic wave device is constructed so that balance-unbalance conversion can be carried out by using two surface acoustic wave elements, and the input/output impedances are different from each other by about four times. The interdigital pitches in the surface acoustic wave elements are set so as to be different from each other. Alternatively, one-terminal-pair surface acoustic wave resonators are connected in series with at least ones of the input and output sides of the surface acoustic wave elements, the interdigital electrode finger pitches of the one-terminal-pair surface acoustic wave resonators provided on the right and left sides are set to be different from each other.

10 Claims, 17 Drawing Sheets

$\lambda t1 \neq \lambda t2$

SURFACE ACOUSTIC WAVE DEVICE

BACKGROUND OF THE INVENTION

1. Field of the Invention

The present invention relates to a surface acoustic wave device especially having a balance-unbalance conversion function.

2. Description of the Related Art

Remarkable technical progress has been made in recent developments of small-sized and light-weight portable telephones. In order to produce such portable telephones, parts with a combination of plural functions have been made as well as the number of components has been reduced and the size of the components has been decreased. In these situations, in recent years, an extensive investigation of surface acoustic wave filters for use in the RF stages of portable telephones, having a balance-unbalance conversion function, a so-called balun function, had been made, and such surface acoustic wave filters have been used mainly in the GSM system (Global System for Mobile Communications).

In the case in which a balanced line such as a twin-lead type feeder and an unbalanced line such as a coaxial cable are connected directly to each other, unbalanced current flows, and undesirably, the feeder itself functions as an antenna. Thus, the team "balun" means a circuit for preventing the unbalanced current and matching the balanced line and the unbalanced line to each other.

Referring to conversion between a balanced signal and an unbalanced signal, in some cases, the input impedance (e.g., 75Ω for an unbalanced signal) and the output impedance (e.g., 300Ω for a balanced signal) are different from each other by approximately a factor of four.

As the basic configuration of a surface acoustic wave device having the above-described balance-unbalance conversion function, the configuration shown in FIG. 14 is widely used. Longitudinally coupled resonator type surface acoustic wave elements 101 and 102 are contained in the configuration shown in FIG. 14.

The surface acoustic wave element 101 contains interdigital electrode portions referred to as an interdigital transducer, hereinafter referred to as IDT, 104, 103, and 105, and has reflectors 106 and 107 arranged so as to sandwich the IDTs.

The surface acoustic wave element 102 contains three IDTs 109, 108, and 110 arranged along the propagation direction of a surface acoustic wave and, moreover, reflectors 111 and 112 arranged so as to sandwich these IDTs.

The above-described configuration contains an unbalanced terminal 113 which causes the terminals on one side of the surface acoustic wave elements 101 and 102 to be electrically connected in parallel to each other, and balanced terminals 114 and 115 which are connected in series with the terminals on the other side of the surface acoustic wave elements 101 and 102.

The surface acoustic wave element 101 and the surface acoustic wave element 102 are different from each other in that the IDT 103 and the IDT 108 are inverted with respect to each other, and thereby, signals output from the balanced terminal 114 and the balanced terminals 115 are 180° out-of-phase. Thus, an unbalanced signal input through the unbalanced terminal 113 is converted to balanced signals which are output from the balanced terminals 114 and 115.

In the above-described configuration, the output impedance is about four times of the input impedance. By exchanging the input terminal and the output terminals in the configuration of FIG. 14, a surface acoustic wave device in which the input impedance is about four times of the output impedance, and balanced inputs and an unbalanced output signal are applied can be provided.

Furthermore, for the surface acoustic wave device having a balance-unbalance conversion function, an excellent attenuation characteristic presented out of the pass band is required. Japanese Unexamined Patent Application Publication No. 6-177697 discloses a method of improving the above-described out-band characteristics. In this Patent Application, as shown in FIG. 15, the configuration is used in which surface acoustic wave resonators 202 and 203 are electrically connected in series with the input and output terminal sides of the surface acoustic wave element 201, respectively.

FIG. 16 shows an example of a surface acoustic wave device having a balance-unbalance conversion function which adopts the above-described configuration. Surface acoustic wave resonators 303 and 304 are connected in series with the input sides of the surface acoustic wave elements 301 and 302, respectively, and surface acoustic wave elements 305 and 306 are connected in series with the output sides, respectively. With this configuration, high attenuation and balance-unbalance conversion can be realized.

Referring to the transmission characteristics in the pass bands caused between the unbalanced signal terminal and the balanced signal terminals of the surface acoustic wave device having a balance-unbalance conversion function, it is required that the amplitude characteristics should be the same, and the phases should be reversed from each other by 180°. These characteristics are expressed in terms of an amplitude balancing degree and a phase balancing degree.

Referring to the amplitude and phase balancing degrees, the surface acoustic wave device having a balance-unbalance conversion function is assumed as a three port device, and for example, the unbalance input terminal is referred to as a first port, and the balanced output terminals are referred to as second and third ports, respectively. In this case, the amplitude balancing degree [A] is defined by A=[20log(S21)]−[20log(S31)], and the phase balancing degree [−180] is defined by B=[<S21−<S31], in which S21 represents a transfer coefficient for the transfer from the first port to the second port, and S31 represents a transfer coefficient for the transfer from the first port to the third port. The symbol [ ] represents the absolute value. Regarding the balancing degrees, the amplitude balancing degree is zero dB, and the phase balancing degree in the pass band of a surface acoustic wave device is zero degree in the ideal condition.

However, in practice, deviations from the balancing degrees are caused in the configuration of FIG. 16. The values are on such a large level as to become problems in practical use. The reason lies in that in the configuration of FIG. 16, the electrode fingers of the IDT 307 adjacent to the IDTs 308 and 309 are grounding electrode fingers, while the electrode fingers of the IDT 312 adjacent to the IDTs 313 and 314, respectively, are signal electrode fingers.

In the case in which the signal electrode and the grounding electrode are adjacent to each other in each of the IDT-IDT interval areas, the efficiency of conversion to electric current caused in the resonance mode having an intensity peak in each IDT-IDT interval area is improved. Thus, the insertion loss in the pass band, especially on the high frequency side, is decreased compared with the case in which the grounding electrode and the signal electrode are adjacent to each other. Moreover, the pass bandwidth is increased, and also, a deviation is caused in the phase-relationship. FIG. 17 shows differences between the frequency characteristics of the surface acoustic wave filters 320 and 321 shown in FIG. 16 and those between the phase characteristics thereof (the matching is made at 100Ω, and the characteristics are obtained in the configuration of FIG. 16).

The difference between the frequency characteristics of the surface acoustic wave filters 320 and 321 becomes large especially on the high frequency side of the pass band. Moreover, the phase characteristics of the surface acoustic wave filters 320 and 321 are not completely inverted from each other, and some deviation from the complete inversion is present. If a surface acoustic wave device is formed using the surface acoustic wave filters 320, and 321, these differences will deteriorate the balancing degrees.

SUMMARY OF THE INVENTION

To solve the above-described problems, preferred embodiments of the present invention provide a surface acoustic wave device having a balance-unbalance conversion function which includes first and second longitudinally coupled resonator type surface acoustic wave elements each having three interdigital electrode portions arranged on a piezoelectric substrate along the propagation direction of a surface acoustic wave, the second surface acoustic wave element having a phase-relationship between the center interdigital electrode portion of the above-described interdigital electrode portions and the interdigital electrode portions sandwiching the center electrode portion which is inverted with respect to the phase-relationship of the first surface acoustic wave element, an unbalanced terminal provided in which each terminal on one side of the first and second surface acoustic wave elements is electrically connected in parallel to each other, and balanced terminals to which each terminal on the other side of the first and second surface acoustic wave elements is electrically connected in series, and an electrode finger pitch in the interdigital electrode portions of the first acoustic wave element is different from the electrode finger pitch in the interdigital electrode portions of the second acoustic wave element.

According to the above-described configuration, the balancing degrees caused between the balanced terminals is greatly improved, since the pitch in the IDTs of the first surface acoustic wave element is different from that in the IDTs of the second surface acoustic wave device.

Preferably, the value of $\lambda ir/\lambda is$ is in the range between about 0.9982 or greater and less than about 1, in which $\lambda is$ represents the electrode finger pitch in the IDTs of the first surface acoustic wave element, and $\lambda ir$ represents the electrode finger pitch in the IDTs of the second surface acoustic wave element. The value of fis/fir may be in the range between about 0.9982 or greater and less than about 1, in which fis represents the frequency caused in the first surface acoustic wave element, and fir represents the frequency caused in the second surface acoustic wave element.

According to the above-described configuration, the improvement of the balancing degrees between the balanced terminals are secured, since the value of $\lambda ir/\lambda is$ or the value of fis/fir is set to be in the range between about 0.9982 or greater and less than about 1.

The frequency fis of the first surface acoustic wave element depends on the piezoelectric substrate, the sound velocity determined by the electrode occupied area ratio in the IDTs of the first surface acoustic wave element disposed on the substrate and the film thickness, and the electrode finger pitch of the EDTs.

The frequency fir of the second surface acoustic wave element depends on the piezoelectric substrate, the sound velocity determined by the electrode occupied area ratio in the IDTs of the second surface acoustic wave element disposed on the substrate and the film thickness, and the electrode finger pitch of the IDTs.

The frequencies fis and fir are preferably set to be different from each other, using the electrode finger pitches of the IDTs. However, the frequencies fis and fir may be set to be different from each other, using another configuration in which the electrode finger pitch of the IDTs is irregular in the propagation direction of a surface acoustic wave, e.g., the pitch of one pair of electrode fingers in an IDT is set to be different from the electrode finger pitch of the other IDTs, and moreover, the ratio of the frequencies caused in the first and second surface acoustic wave elements is set to conform to the above-described conditions so that a desired frequency characteristic can be attained.

According to another preferred embodiment of the present invention, a surface acoustic wave device having a balance-unbalance conversion function includes first and second longitudinally coupled resonator type surface acoustic wave elements each having a plurality of interdigital electrode portions arranged on a piezoelectric substrate along the propagation direction of a surface acoustic wave, the second surface acoustic wave element having a phase-relationship between the center interdigital electrode portion of the above-described interdigital electrode portions and the interdigital electrode portions sandwiching the center electrode portion which is inverted with respect to the phase-relationship of the first surface acoustic wave element, first and second one-terminal-pair surface acoustic wave resonators electrically connected in series to at least one terminal of the first and second surface acoustic wave elements, respectively, whereby first and second surface acoustic wave filters are provided, an unbalanced terminal causing the terminals on one side of the first and second surface acoustic wave filters to be electrically connected in parallel to each other, and balanced terminals electrically connected in series with the terminals on the other side of the first and second surface acoustic wave filters, respectively, and electrode finger pitch of the first one-terminal-pair surface acoustic wave resonator is different from the electrode finger pitch of the second one-terminal-pair surface acoustic wave resonator.

According to the above-described configuration, the balancing degrees caused between the balanced terminals is greatly improved, since the electrode finger pitch in the IDT of the first one-terminal-pair surface acoustic wave resonator is different from that in the IDT of the second one-terminal-pair surface acoustic wave resonator.

Preferably, the value of $\lambda tr/\lambda ts$ is in the range between about 0.994 or greater and less than about 1, in which %ts represents the electrode finger pitch in the IDT of the first one-terminal pair surface acoustic wave resonator, and $\lambda tr$ represents the electrode finger pitch in the IDT of the second one-terminal-pair surface acoustic wave resonator. The value of fis/fir may be in the range between about 0.994 or greater and less than about 1, in which fts represents the frequency caused in the first one-terminal-pair surface acoustic wave resonator, and ftr represents the frequency caused in the second one-terminal-pair surface acoustic wave resonator.

According to the above-described configuration, the improvement of the balancing degrees between the balanced terminals are secured, since the value of $\lambda tr/\lambda ts$ or the value of fts/ftr is in the range between about 0.994 or greater and less than about 1.

The frequency fts of the first one-terminal-pair surface acoustic wave resonator depends on the piezoelectric substrate, the sound velocity determined by the electrode occupied area ratio in the IDT of the one-terminal-pair first surface acoustic wave resonator disposed on the substrate and the film thickness, and the electrode finger pitch in the IDT.

The frequency ftr of the second one-terminal-pair surface acoustic wave resonator depends on the piezoelectric substrate, the sound velocity determined by the electrode occupied area ratio in the IDT of the second one-terminal-pair surface acoustic wave resonator disposed on the substrate and the film thickness, and the electrode finger pitch in the IDT. In the above-description, the frequencies fts and ftr may be set to be different from each other, using the electrode finger pitches of the IDTs. However, the frequencies fts and ftr may be set to be different from each other, using another configuration in which the electrode finger pitch in the IDT is set to be irregular in the propagation direction of a surface acoustic wave, e.g., the pitch of one pair of electrode fingers in the IDT is set to be different from the electrode finger pitch of the other IDT, and moreover, the ratio of the frequencies caused in the first and second one-terminal-pair surface acoustic wave resonators is set to conform to the above-described conditions so that a desired frequency characteristic can be attained.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of the present invention will be described with reference to FIGS. 1 to 13.

Figure 16:
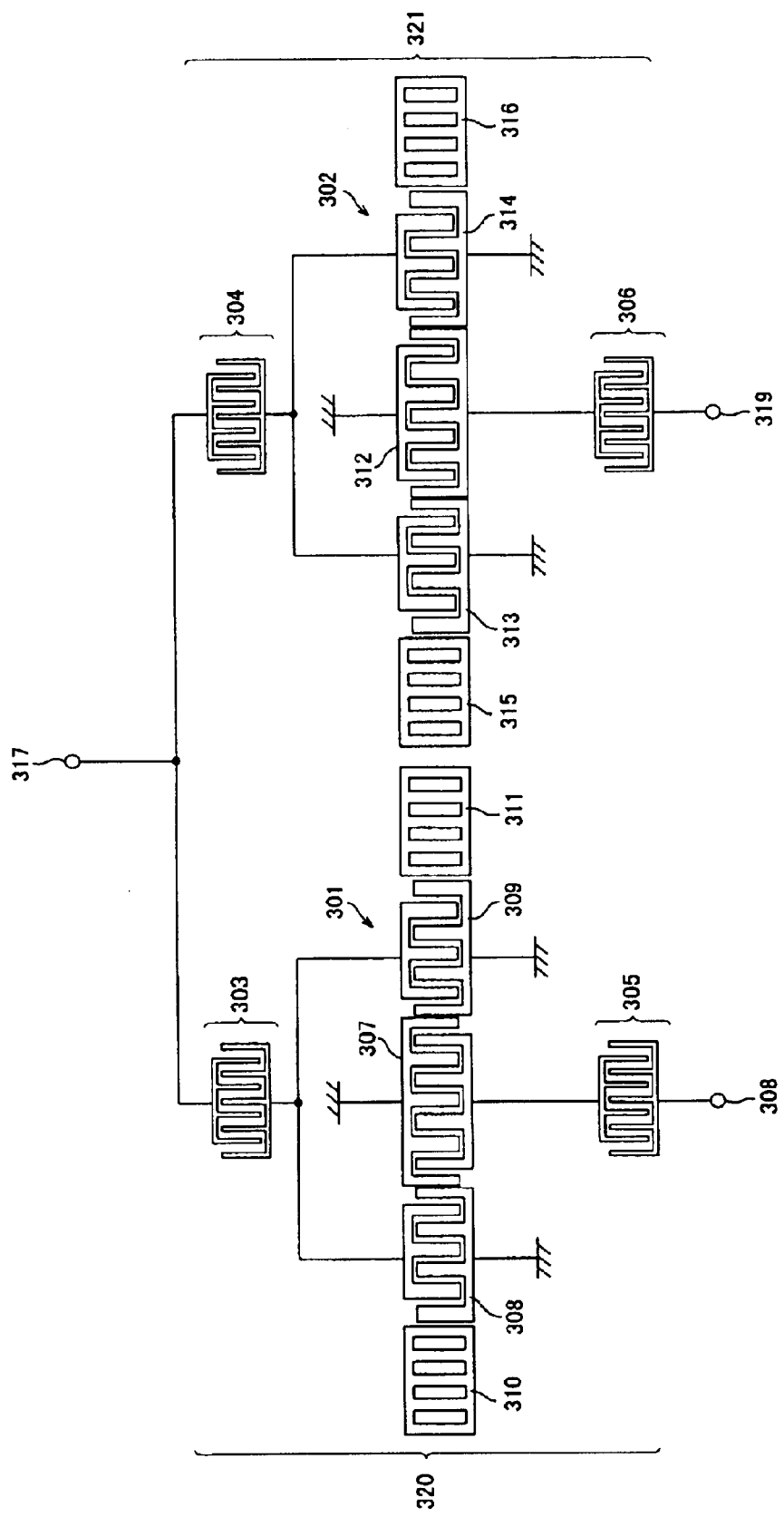
FIG. 16 is a schematic view showing the configuration of a surface acoustic wave device of which the out-of-band characteristic is satisfactory, and the input and output impedances are different from each other by about four times.
Figure 17:
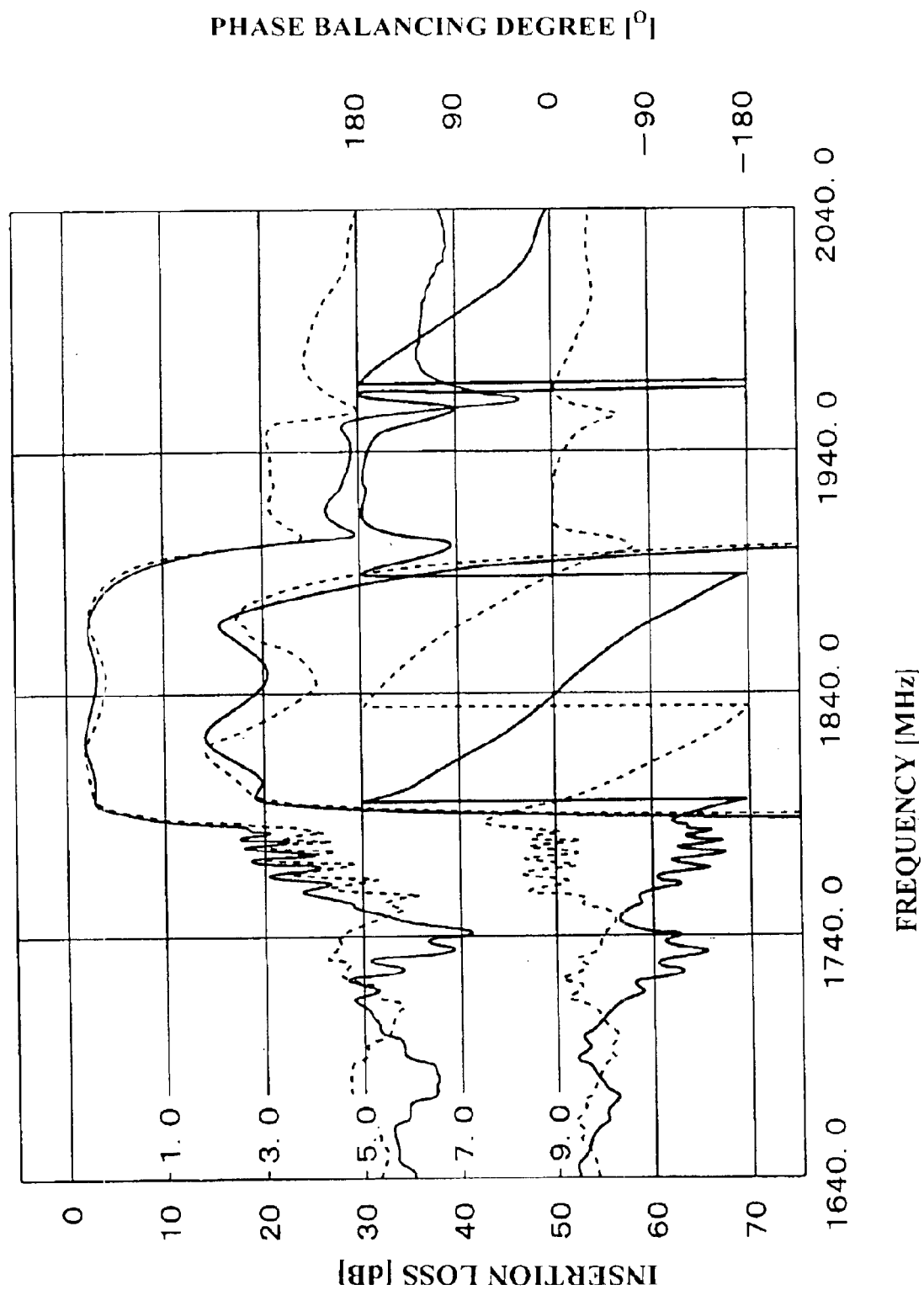
FIG. 17 is a graph showing the differences in the frequency characteristics of the surface acoustic wave filters 320 and 321 shown in FIG. 16 (the solid lines represent the frequency characteristic and the phase characteristics of the surface acoustic wave filter 320, and the broken lines represent the frequency characteristic and the phase characteristic of the surface acoustic wave filter 321).

The element configuration of a first preferred embodiment of the present invention is similar to that of the comparative example shown in FIG. 16. The relationships between the wavelengths of the respective elements of the comparative example are shown by the following formulae (1). The relationships between the wavelengths of the respective elements of the first embodiment of the present invention are shown by the following formulae (2).

$$\lambda I1=\lambda I2,\ \lambda i1=\lambda i2,\ \lambda r1=\lambda r2,\ \lambda ti1=\lambda ti2,\ \lambda to1=to2 \qquad \ldots (1)$$

$$\lambda I1\neq\lambda I2,\ \lambda i1\neq\lambda i2,\ \lambda r1\neq\lambda r2,\ (\lambda r1/\lambda I1=\lambda r2/\lambda I2,\ \lambda i1/\lambda I1=\lambda i2/\lambda I2),$$
$$\lambda ti1=\lambda ti2,\ \lambda to1=\lambda to2 \qquad \ldots (2)$$

Hereinafter, the respective preferred embodiments will be described with reference to the DSC reception filter as an example.

In the first preferred embodiment, the respective IDTs and the reflectors of the surface acoustic wave device are disposed on a piezoelectric substrate 20 which is preferably made of a 40±5° Y-cut X-propagation LiTaO$_3$ using aluminum (Al) electrodes by photolithography or other suitable substrate.

Each of the IDTs includes belt-shaped base-end portions (bus bars), and two electrode finger portions each having at least two electrode fingers disposed substantially parallel to each other, extended from one side of each base-end portion in the direction that is substantially perpendicular to the base-end portion. The electrode fingers of the electrode finger portions are interdigitated in such a manner that the side portions of the electrode fingers of the electrode finger portions face each other, respectively.

In the above-described IDTs, the signal conversion characteristic and the pass-band can be set by setting the length and width of each electrode finger, the interval between adjacent electrode fingers, and the interdigitating width which means the length over which the sides of interdigitated electrode fingers face each other. When an electrical signal (AC) is input to the electrode fingers of one electrode finger portion in the above-described IDT, surface acoustic waves are generated and propagated on the piezoelectric substrate 20 in the two electrode finger-width directions.

The configuration of the first preferred embodiment of the present invention will be detailed. IDTs 408 and 409 are arranged on the right and left sides (in the propagation direction of a surface acoustic wave) of IDT 407. Reflectors 410 and 411 are arranged so as to sandwich the IDTs 408, 407, and 409, whereby a longitudinally coupled resonator type surface acoustic wave element 401 is provided.

The reflectors 410 and 411 are used to reflect a surface acoustic wave propagated in the propagation direction. Here, the electrode finger pitches in portions 422, 424, 425, and 427 of the IDTs 407, 408, and 409 are preferably smaller (narrow pitch electrode fingers) than those of the other portions of the respective IDTs. This can reduce the insertion loss.

A surface acoustic wave element 402 is preferably formed in the same manner as the surface acoustic wave element 401 except that output signals from the elements 401 and 402 are 180° out-of-phase. One-terminal-pair surface acoustic wave resonators 403 and 404 and, moreover, one-terminal-pair surface acoustic wave resonators 405 and 406 are connected to the surface acoustic wave elements 401 and 402, respectively. Thereby, surface acoustic wave filters 420 and 421 are provided, respectively.

Figure 1:
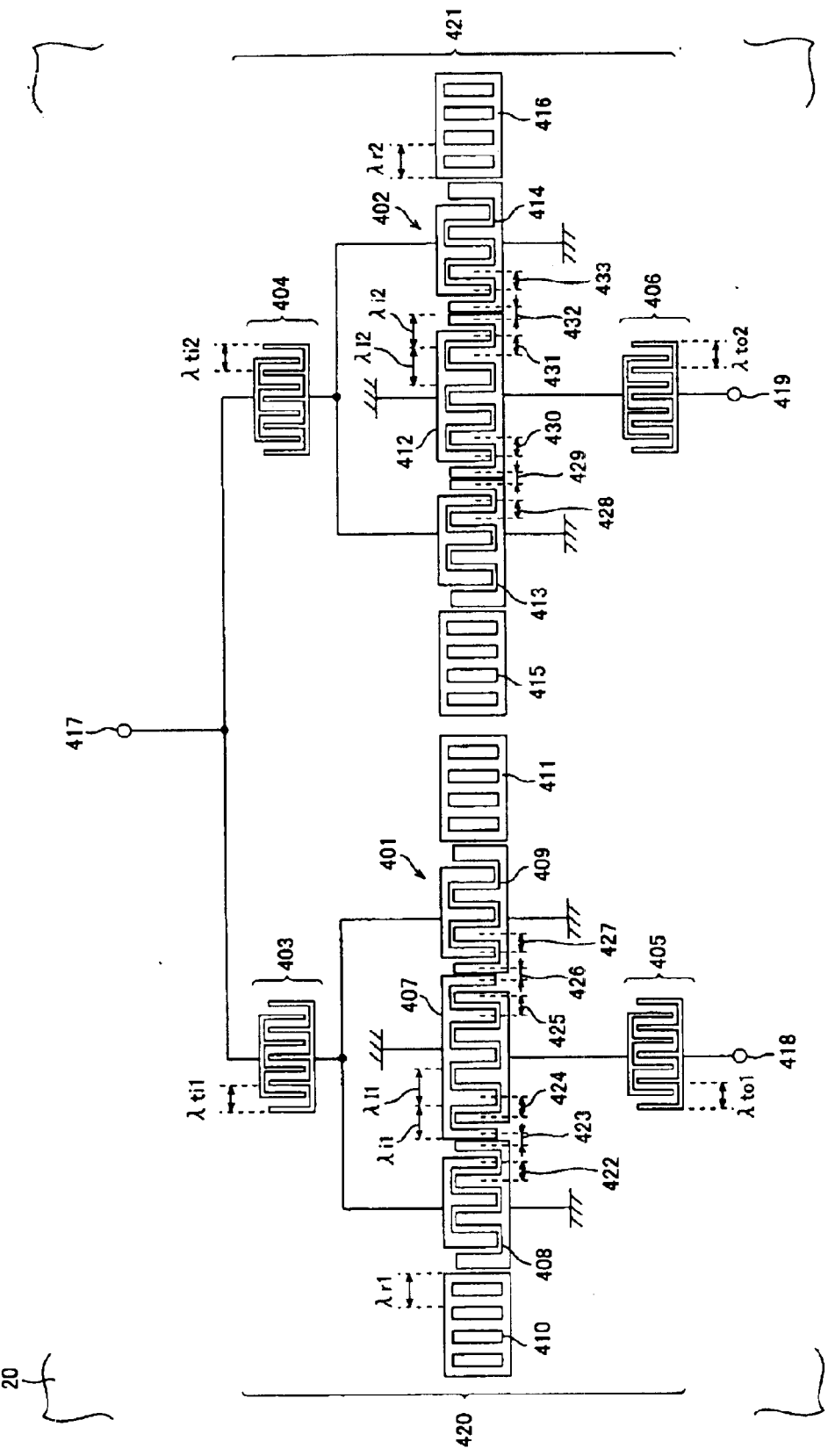
FIG. 1 is a schematic view showing the configuration of a surface acoustic wave device according to a first preferred embodiment of the present invention.

It should be noted that a reduced number of the electrode fingers are depicted in FIG. 1 for simple illustration. Balanced terminals 418 and 419 for balanced signals are arranged so as to be connected to the IDTs 407 and 412 via the one-terminal-pair surface acoustic wave resonators 405 and 406, respectively. An unbalanced terminal 417 for an unbalanced signal is connected to the IDTs 408, 409, 413 and 414 via the one-terminal-pair surface acoustic wave resonators 403 and 404, respectively.

The detailed design of the surface acoustic wave elements 401 and 402 is as follows in which $\lambda i1$ and $\lambda i2$ represent the wavelengths determined by the pitches of the narrow electrode fingers, $\lambda I1$ and $\lambda I2$ represent the wavelengths determined by the pitches of the other electrode fingers, and $\lambda r1$ and $\lambda r2$ represent the wavelengths caused in the reflectors: the interdigitating width of about 75 $\mu$m; the numbers of the electrode fingers in the IDTs (408, 407, and 409 in that order) of 20(3)/(3)29(3)/(3) 20 (parenthetic figures are the numbers of the narrow pitch electrode fingers, the same is true of the numbers of the electrode fingers in the IDTs 413, 412, and 414); IDT $\lambda I1$ of about 2.142 $\mu$m, IDT $\lambda I2$ of about 2.141 $\mu$m; narrow pitch IDT wavelength $\lambda i1$ of about 1.936 $\mu$m; $\lambda i2$ of about 1.935 $\mu$m; reflector wavelength $\lambda R1$ of about 2.177 $\mu$m, $\lambda R2$ of about 2.176 $\mu$m; the number of electrode fingers in a reflector of 150; the IDT-IDT interval for the portion sandwiched by the electrode fingers having wavelengths of $\lambda I1$ and $\lambda i1$ (422, 424, 425, and 427 in FIG. 1) of about $0.25\ \lambda I1 + 0.25\lambda i1$, that for the portion sandwiched by the electrode fingers having a wavelength of $\lambda i1$ (423, 426 in FIG. 1) of $0.50\ \lambda i1$, that for the portion sandwiched by the electrode fingers having wavelengths of $\lambda I2$ and $\lambda i2$ (428, 430, 431, and 433 in FIG. 1) of about $0.25\ \lambda I2 + 0.25\ \lambda i2$, that for the portions sandwiched between the electrode fingers having a wavelength $\lambda i2$ (429 and 432 in FIG. 1) of about $0.50\ \lambda i2$; the IDT-reflector interval of about $0.50\ \lambda R$; IDT duty of about 0.63; reflector duty of about 0.57; and electrode film thickness of about $0.096\ \lambda I$.

The detailed design of the one-terminal-pair surface acoustic wave resonators 403 and 404 is as follows: $\lambda ti1 = \lambda ti2$ in the first preferred embodiment in which $\lambda ti1$ and $\lambda ti2$ represent the wavelengths determined by the pitches of the electrode fingers; the interdigitating width of about 75 $\mu$m; the IDT number of 241; the IDT wavelength $\lambda ti$ of about 2.050 $\mu$m; and the electrode film-thickness of about 0.10, $\lambda ti$, in which both of the wavelengths are represented by $\lambda ti$.

Referring to the detail design of the one-terminal-pair surface acoustic wave resonators 405 and 406, $\lambda to1 = \lambda to2$ in the first preferred embodiment, in which $\lambda ti1$ and $\lambda ti2$ represent the wavelengths det of the wavelengths are represented by $\lambda ti$, the interdigitated electrode finger width is about 40 $\mu$m, the number of electrode fingers in IDT is 100, the wavelength $\lambda to$ for IDT is about 2.110 $\mu$m, and the electrode film thickness is about $0.097\ \lambda to$.

Figure 2:
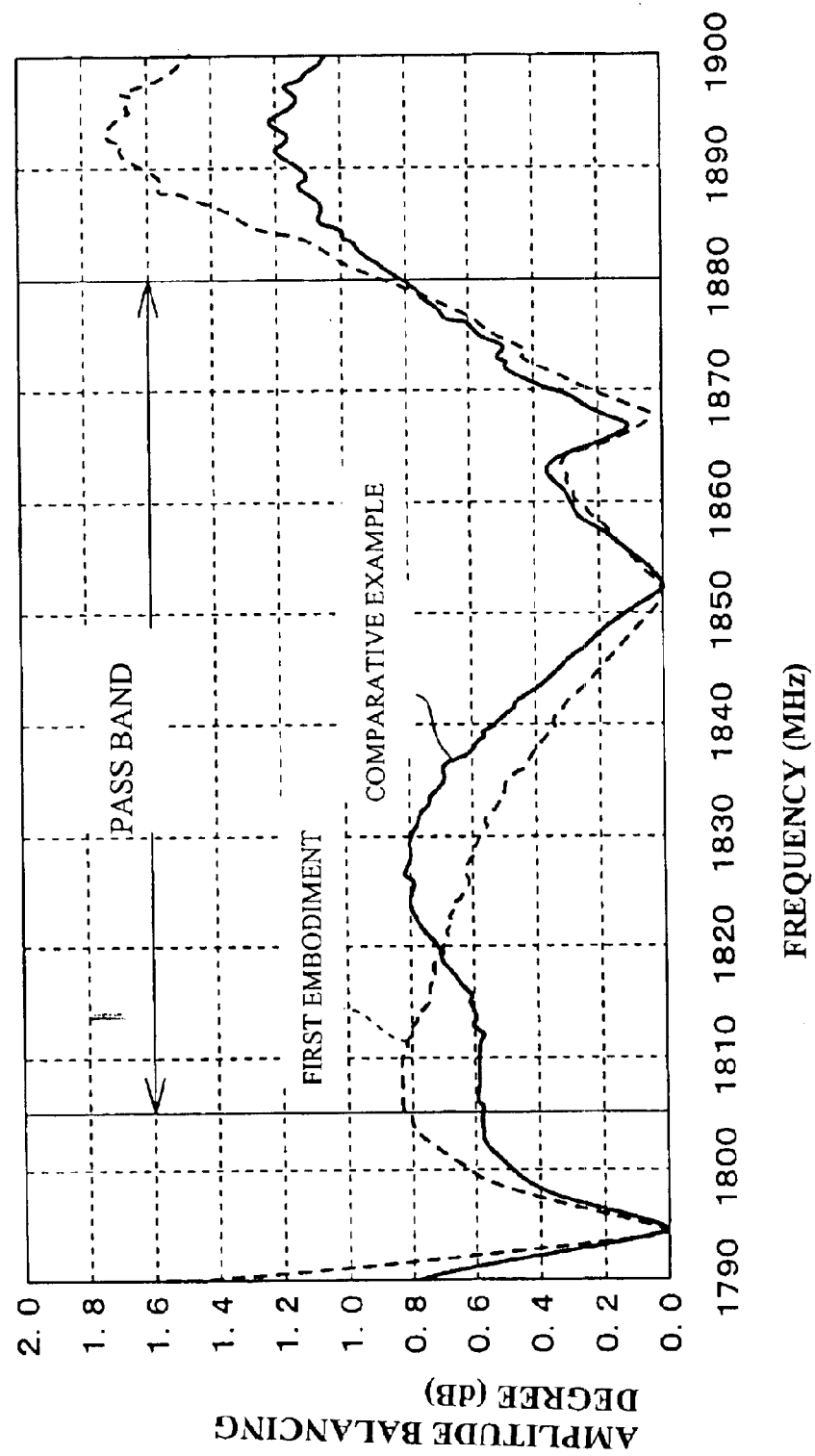
FIG. 2 is a graph showing the amplitude balancing degrees of the first preferred embodiment and a comparative example.
Figure 3:
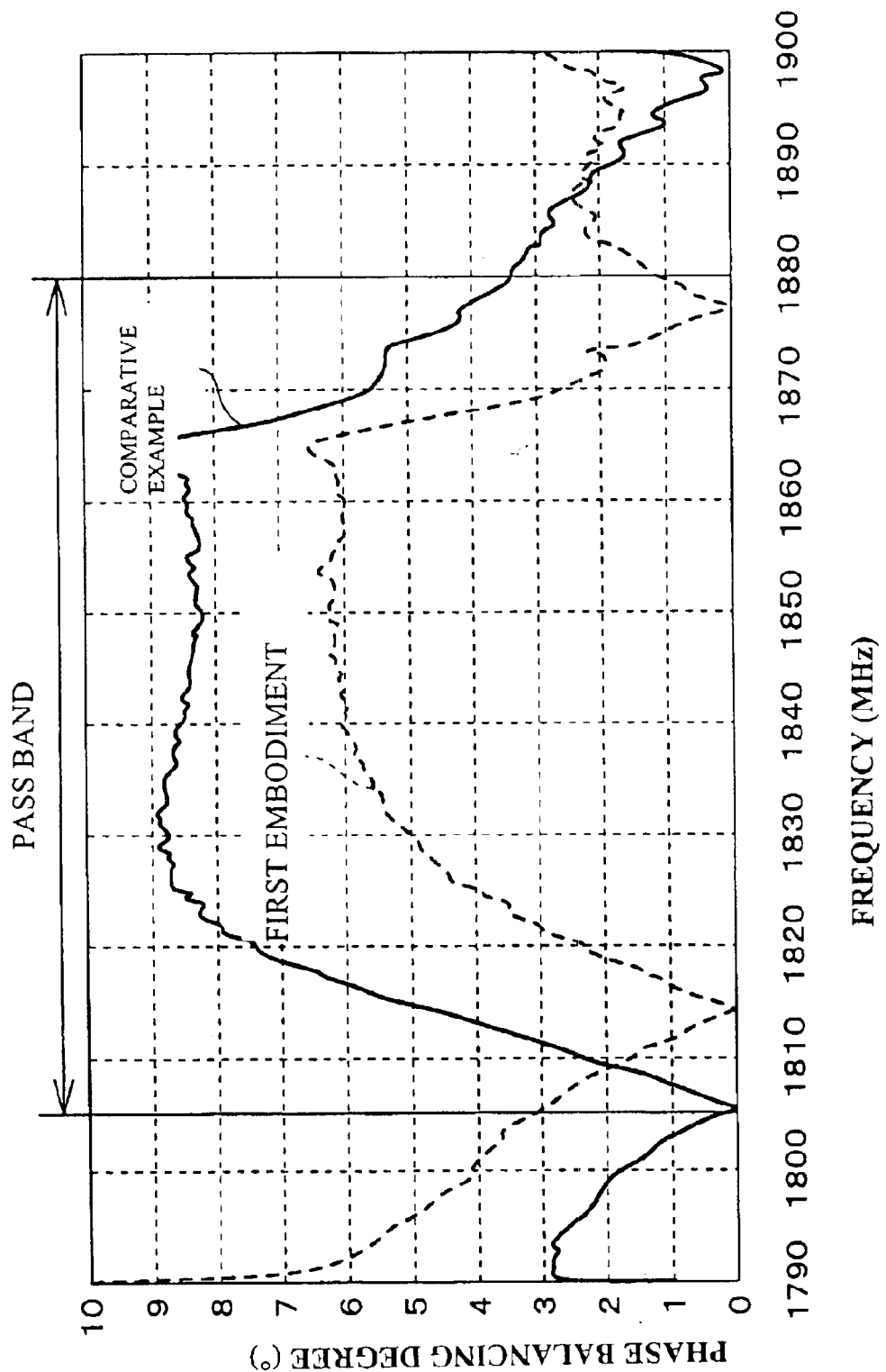
FIG. 3 is a graph showing the phase balancing degrees of the first preferred embodiment and the comparative example.

Next, FIG. 2 is a graph showing the frequency versus the amplitude balancing degree obtained in the configuration of the first preferred embodiment of the present invention. FIG. 3 is a graph showing the phase balancing degree. For comparison, the characteristics of the amplitude and phase balancing degrees are shown which are obtained in the configuration of the comparative example having the above-described wavelength relationships of the formulae (1). The frequency of the pass band in the DCS reception filter ranges from about 1805 MHz to about 1880 MHz. The maximum phase balancing degree in this range is 9° for the comparison example, and is about 6.5° for the first preferred embodiment. That is, the phase balancing degree is improved by about 2.5°. The amplitude balancing degrees for the comparison example and the first preferred embodiment are not different from each other, that is, about 0.8 dB.

The reason why the first preferred embodiment achieves such advantages will be described. As described for the related art, the electrode fingers of the IDT 407 adjacent to the respective IDTs 408 and 409 are grounding electrodes, while the electrode fingers in the IDT 412 adjacent to the respective IDTs 413 and 414 are signal electrodes. This is one of the reasons why the balancing degrees are deteriorated in the configuration of FIG. 1. Thus, if the following correction is not made, the frequency and phase characteristics of the surface acoustic wave filters 420 and 421 are deviated from each other. As a result, the balancing degrees are deteriorated.

In the first preferred embodiment, the pitch ratios of the reflectors 415 and 416 and the respective IDTs 413, 412, and 414 are set to be constant, respectively, and moreover, the pitches in the IDTs 413, 412, and 414 are set to be smaller than those in the IDTs 408, 407, and 409, whereby the deviations between the frequency and phase characteristics of the surface acoustic wave filters 420 and 421 are corrected, and the balancing degrees are greatly improved.

Figure 4:
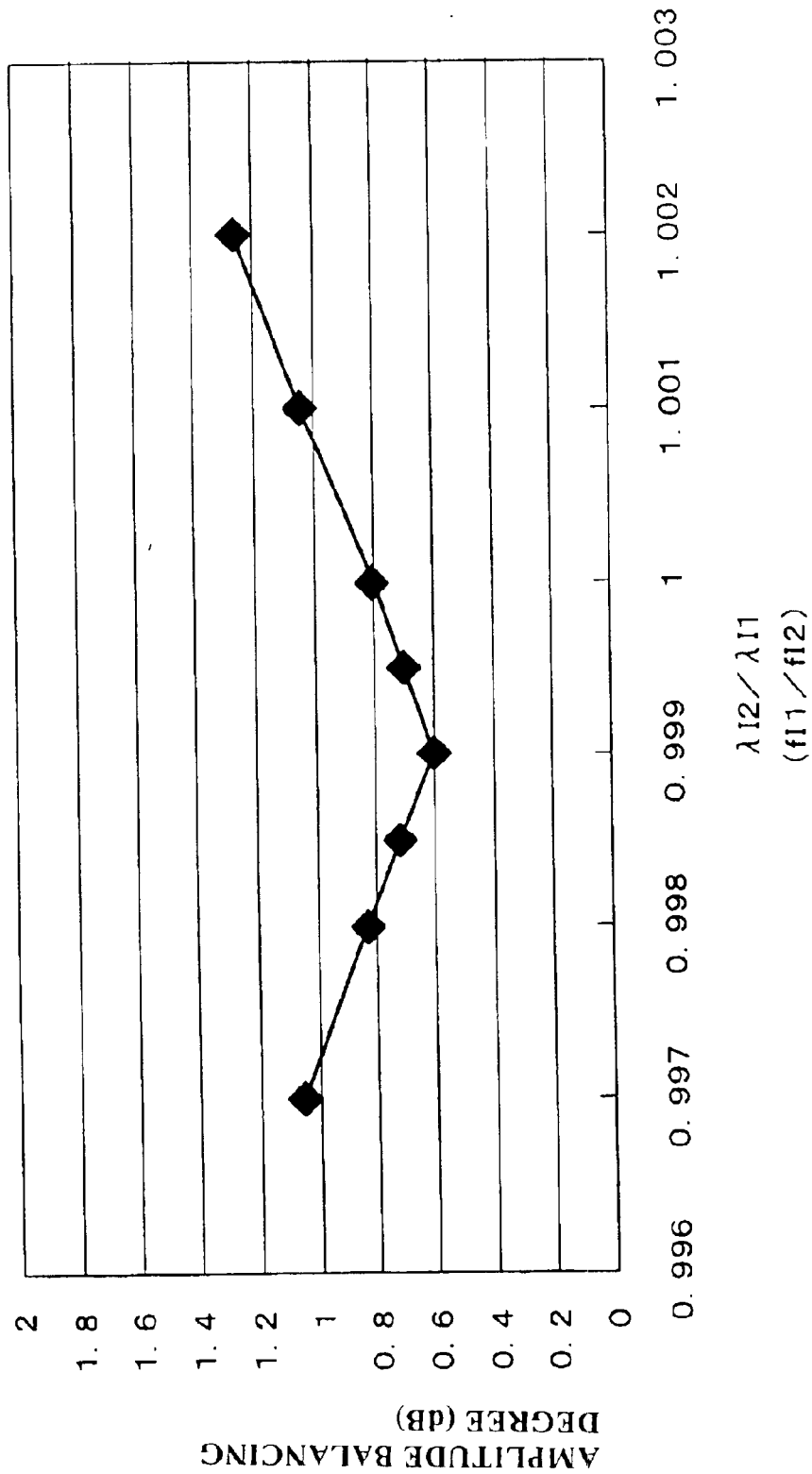
FIG. 4 is a graph showing the change of the amplitude balancing degree, obtained when the pitch ratios of the reflector and the IDTs of the surface acoustic wave device 402 shown in FIG. 1, and only the pitch in the IDTs is changed.
Figure 5:
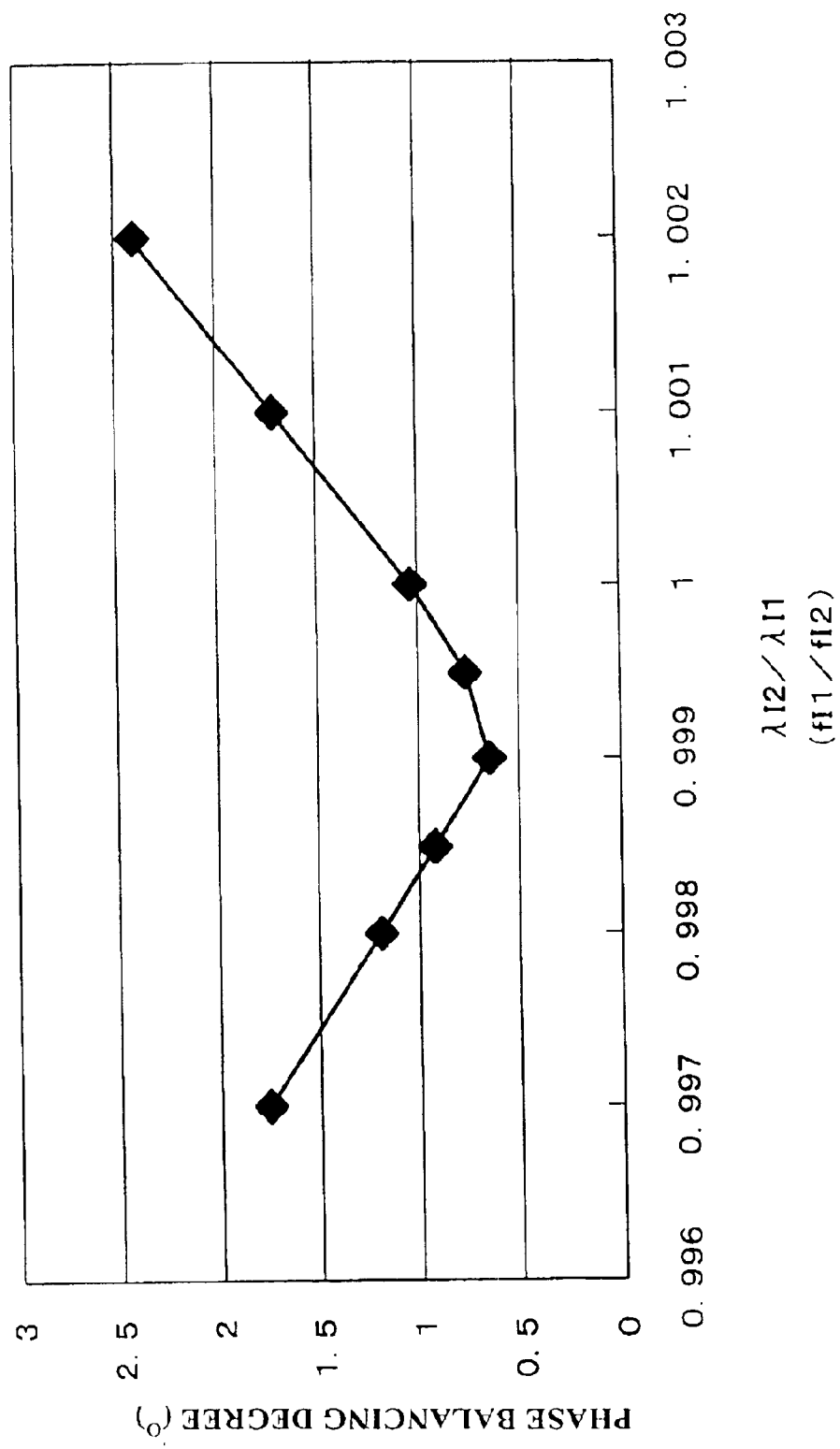
FIG. 5 a graph showing the change of the phase balancing degree, obtained when the pitch ratios of the reflector and the IDTs of the surface acoustic wave device 402 shown in FIG. 1, and only the pitch in the IDTs is changed.

The change of the maximum amplitude balancing degree and the maximum phase balancing degree in a required frequency range was investigated while the pitch ratios of the reflectors and the IDTs in the surface acoustic wave element 402 were set to be constant, and only the pitches of the IDTs were changed, were investigated. FIGS. 4 and 5 show the results. The ratios of the wavelengths caused by the surface acoustic wave element 402 to those by the surface acoustic wave element 401 determined by the pitches of the IDTs thereof are plotted as the abscissa of the graph.

Moreover, the ratios fl1/fl2 in which fl1 (fis) is the frequency determined by the pitch in the IDTs of the surface acoustic wave element 401 and the sound velocity, and fl2 (fir) is the frequency determined by the pitch in the IDTs of the surface acoustic wave element 402 and the sound velocity are plotted as abscissa. In this case, the amplitude balancing degree and the phase balancing degree is similarly changed as shown in FIGS. 4 and 5.

The amplitude balancing degree is improved when the pitch ratios ($\lambda I2/\lambda 12$) of the respective IDTs in the surface acoustic wave elements 401 and 402 or the frequency ratios (fl1/fl2) determined by the pitches and the sound velocity are in the range between about 0.9982 and less than about 0.9, preferably, in the range between about 0.9985 and less than about 0.9995, compared with that obtained when the wavelengths are the same (the pitches are the same) or the frequencies are the same.

Similarly, the phase balancing degree becomes minimum at nearly 0.999, and is improved in the range between about 0.9982 and less than about 1, preferably, in the range between about 0.9986 and about 0.9996, compared to that obtained when the wavelengths are the same (the pitches are the same) or the frequencies are the same.

As described above With reference to FIG. 1, as an example, the pitches in the: IDTs of the surface acoustic wave element 402 in which the electrode fingers of the center IDT adjacent to the IDTs on the right and left sides, respectively, are signal electrodes, and the electrode fingers of the IDTs on the right and left sides of the center IDT and adjacent to the center IDT are grounding electrodes, respectively, are set to be smaller than the pitches in the IDTs of the surface acoustic wave element 401.

That is, in this case, the phase and amplitude characteristics of the surface acoustic wave filter 421 are frequency-shifted so as to be ideally inverted with respect to those of the surface acoustic wave filter 420, since the pitch ratios of the IDTs on the right and left sides are changed.

In the first preferred embodiment of the present invention, the pitch ratio of the reflectors and the IDTs of the element is constant, and only the pitches in the IDTs are changed. However, even if the pitch ratio is not constant, the same advantages can be obtained, provided that the pitch ratio is changed in the range in which the characteristics are not significantly changed.

Moreover, in the first preferred embodiment of the present invention, the surface acoustic wave device is constructed in such a manner that the pitch in the IDTs of each of the surface acoustic wave elements 401 and 402 is constant. Similar advantages can be also obtained, when the pitch in the IDTs is not constant, that is, the pitch of one pair of electrode fingers in the LDTs is different from the pitch of the other electrode fingers in the IDTs, and the frequency ratio of the surface acoustic wave elements 401 and 402 is set so as to satisfy the above-described conditions.

Moreover, in the first preferred embodiment, no reflectors are provided for the one-terminal-pair surface acoustic wave resonators 403 and 404. Similar advantages can be also obtained, when reflectors are provided to provide surface acoustic wave resonators having a high Q value characteristic.

Figure 6:
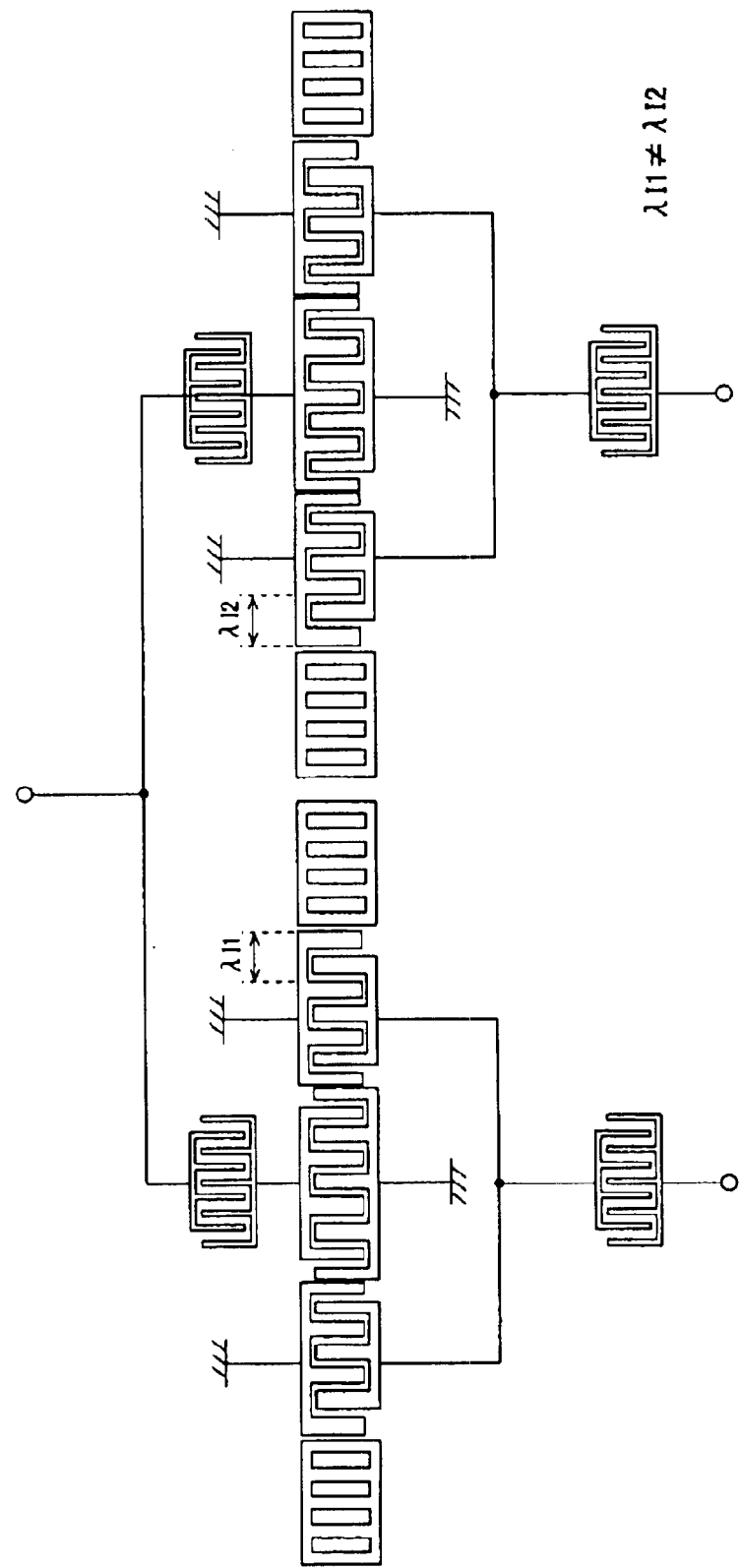
FIG. 6 is a schematic view showing the configuration of a surface acoustic wave device according to a modification of the first preferred embodiment of the present invention.
Figure 7:
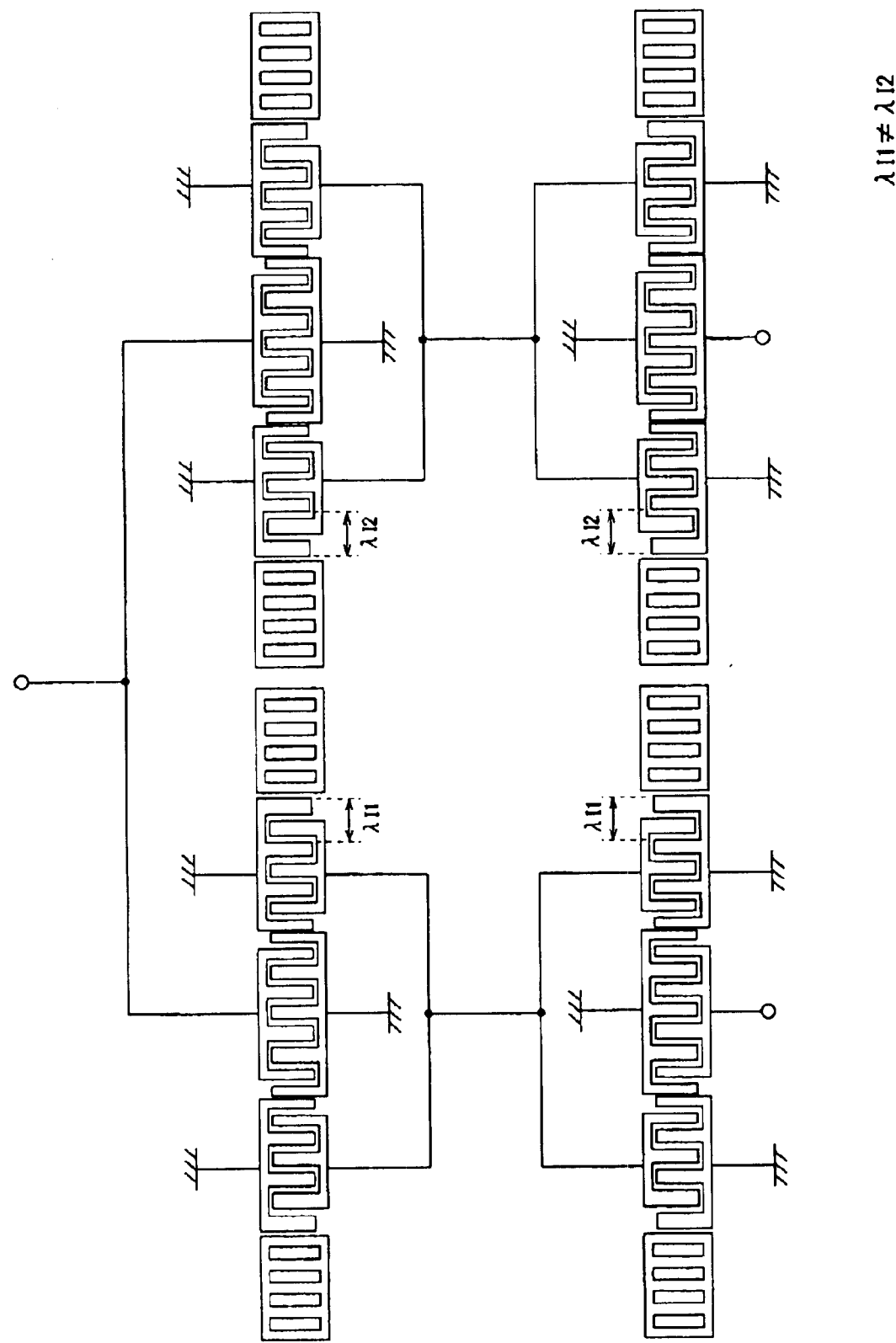
FIG. 7 is a schematic view showing the configuration of a surface acoustic wave device according to another modification of the first preferred embodiment of the present invention.
Figure 8:
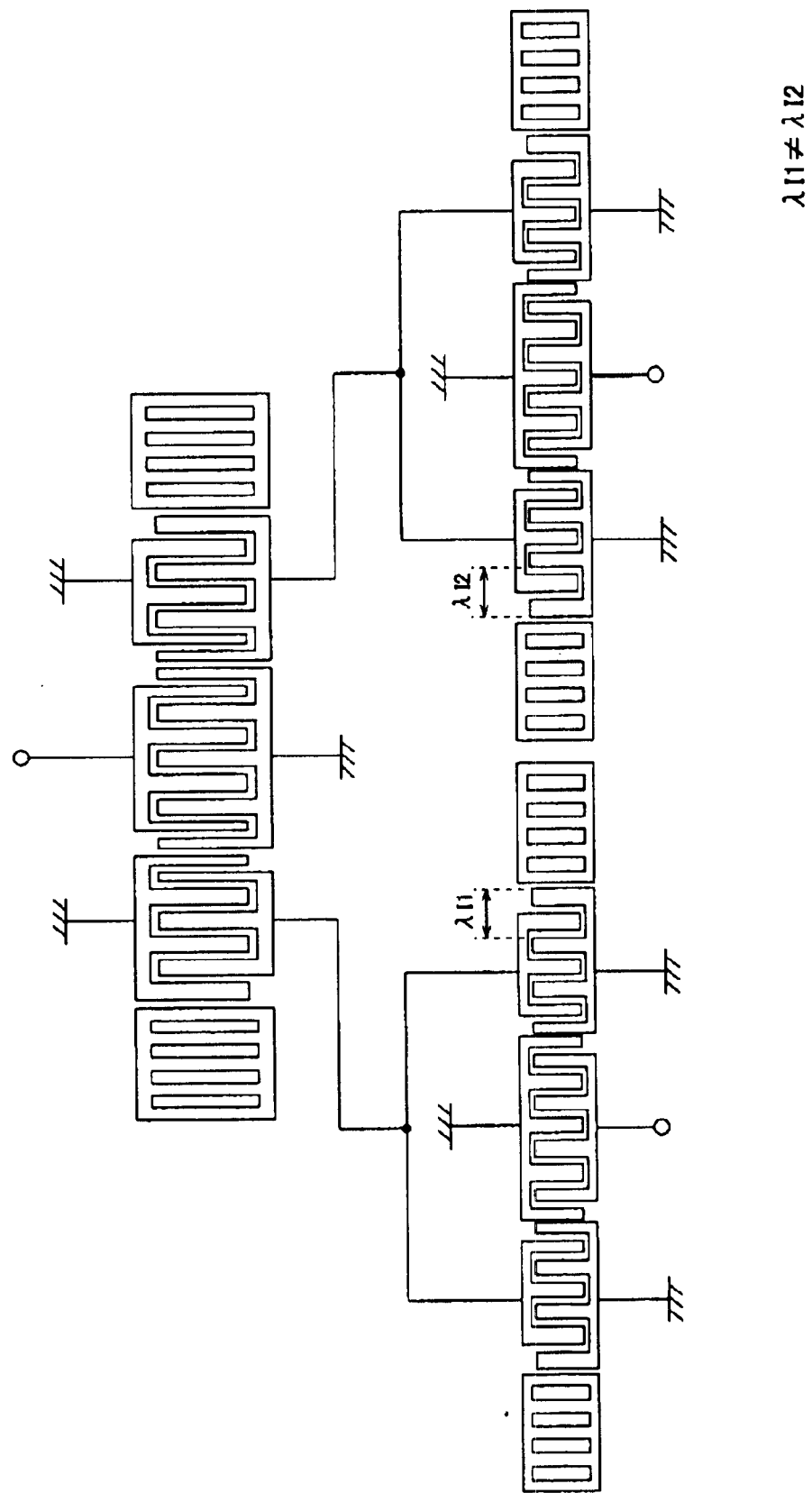
FIG. 8 is a schematic view showing the configuration of a surface acoustic wave device according to still another modification of the first preferred embodiment of the present invention.

FIGS. 6 to 8 show modifications of the first preferred embodiment of the present invention. In the surface acoustic wave device of the first preferred embodiment which carries out balance-unbalance conversion using the two surface acoustic wave elements, the pitches of the IDTs of the first surface acoustic wave element and the second surface acoustic wave element are set to be different from each other, and thereby, the surface acoustic wave device having improved amplitude and phase balancing degrees can be provided.

In the first preferred embodiment, the piezoelectric substrate 20 made of 40±5° Y-cut X-propagation $LiTaO_3$ is preferably used. As understood in the principle in which the advantages can be obtained, the present invention is not restricted to the specific piezoelectric substrate 20. The same advantages can be also obtained when piezoelectric substrates made of 64~72° Y-cut X-propagation $LiNbO_3$, 41° Y-cut X-propagation $LifTbO_3$ or other suitable substrate are used.

Hereinafter, a second preferred embodiment of the present invention will be described. The basic configuration of the second preferred embodiment is the same as that shown FIG. 1. The relationships of the wavelengths of the respective elements are represented by the following formulae (3).

$$\lambda II=\lambda I2, \lambda il=\lambda i2, \lambda rl=\lambda r2, \lambda ti1=\lambda ti2, \lambda tol \neq \lambda to2 \quad \ldots (3)$$

The second preferred embodiment is different from the first preferred embodiment as follows. According to the first preferred embodiment, the pitch in the surface acoustic wave element 401 is set to be different from that in the surface acoustic wave element 402. On the other hand, the pitch of the one-terminal-pair surface acoustic wave resonator 405 is set to be different from that of the one-terminal-pair surface acoustic wave resonator 406.

Referring to the detailed design, only the differences between the second and first preferred embodiments will be pointed out as follows: the IDT wavelength $\lambda I1$ ($\lambda I2$) of about 2.142 $\mu m$; the narrow pitch IDT wavelength $\lambda il$ ($\lambda i2$) of about 1.936 $\mu m$; the reflector wavelength $\lambda R$ of about 2.177 $\mu m$; the IDT wavelength $\lambda toI$ of about 2.110 $\mu m$; and $\lambda to2$ of about 2.103 $\mu m$.

Figure 9:
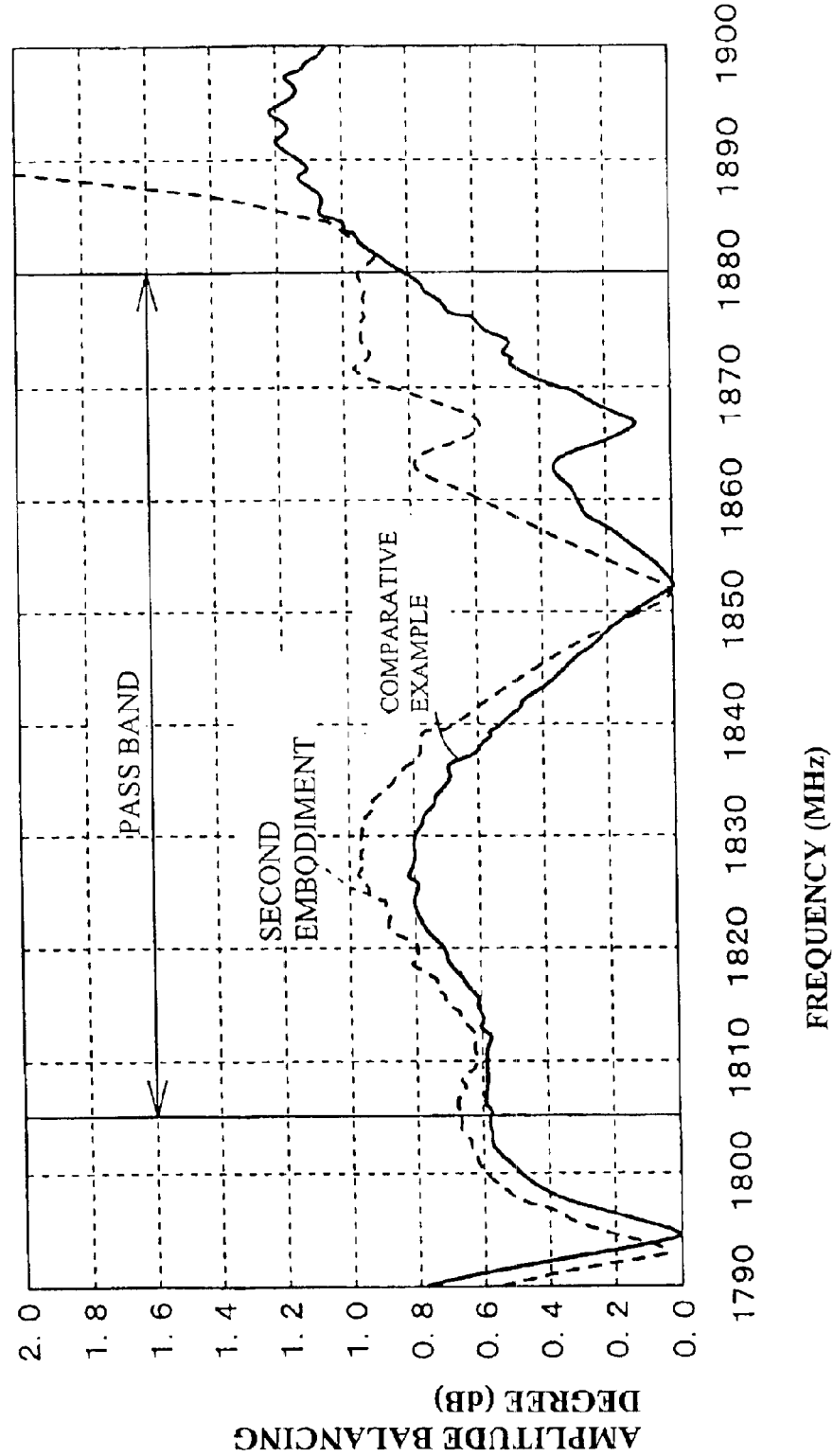
FIG. 9 is a graph showing the amplitude balancing degrees of a surface acoustic wave device according to a second preferred embodiment of the present invention and the comparative example.
Figure 10:
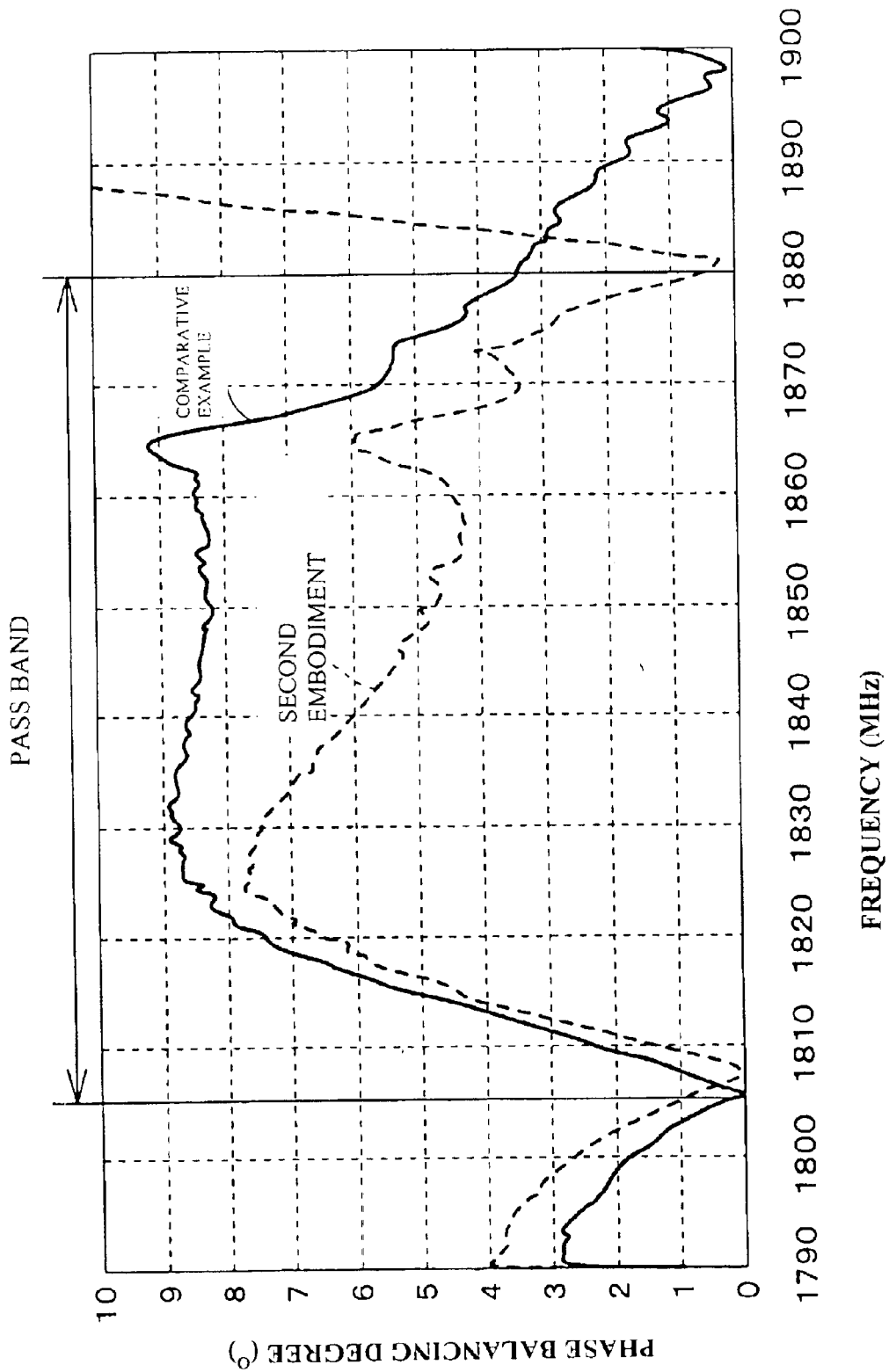
FIG. 10 is a graph showing the phase balancing degrees of the second preferred embodiment and the comparative example.

Hereinafter, the operation and effect of the second preferred embodiment will be described below. FIG. 9 is a graph showing the frequency versus the amplitude balancing degree obtained in the configuration of the second preferred embodiment. FIG. 10 is a graph showing the frequency versus the phase balancing degree. For comparison, the characteristics of the amplitude and phase balancing degree obtained in the configuration having the formula (1) of the wavelength relationship are also shown. The frequency of the pass band in a DCS reception filter ranges from about 1805 MHz to about 1880 MHz. The maximum phase balancing degree in this range is 9° for the comparative example and is about 7.5° for the second preferred embodiment. That is, the phase balancing degree is improved by about 1.5°. Furthermore, the amplitude balancing degree is 0.8 dB for the comparative example and is about 1.0 dB for the second preferred embodiment. That is, the amplitude balancing degree is deteriorated by about 0.2 dB.

Figure 11:
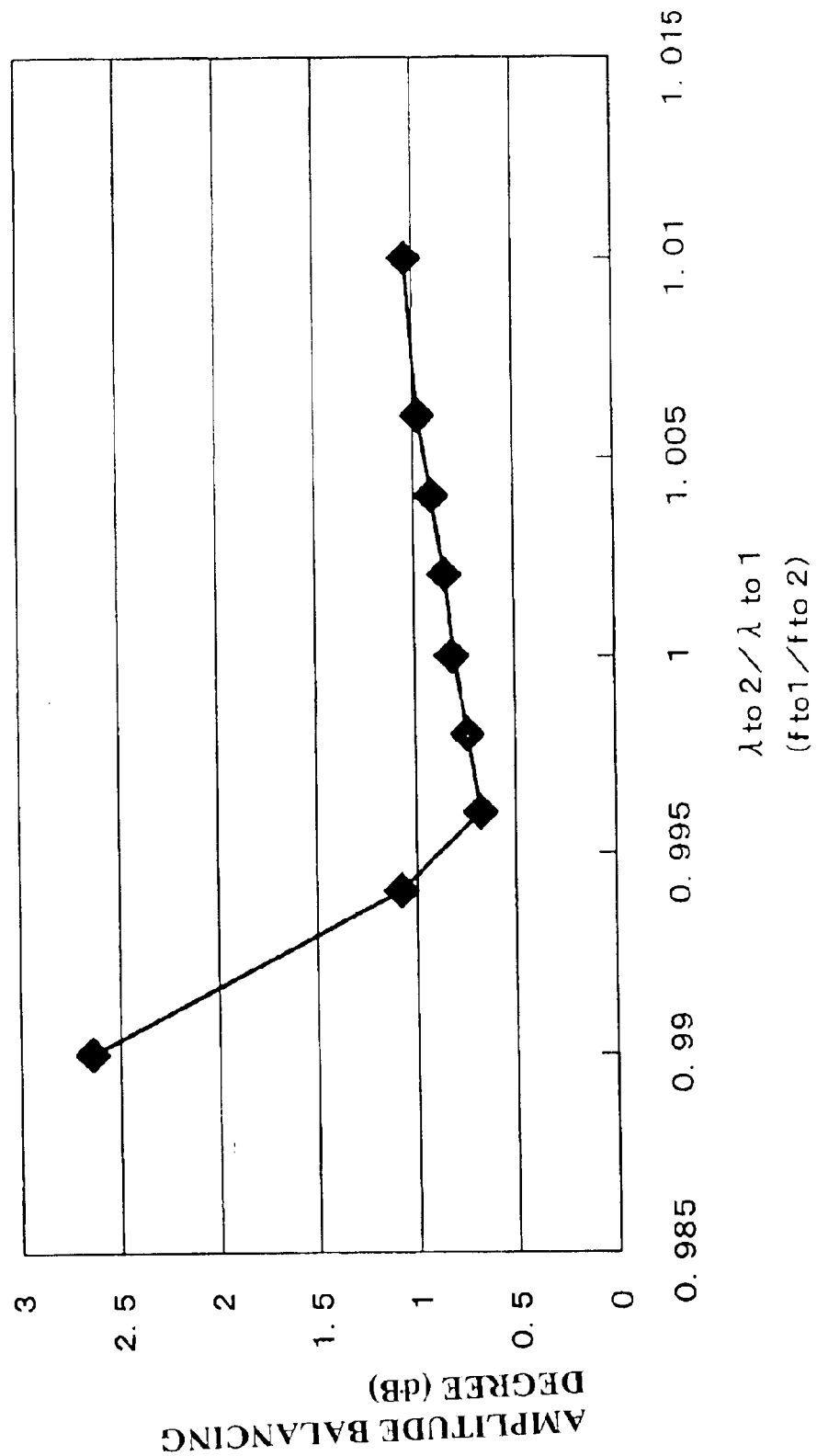
FIG. 11 is a graph showing the change of the amplitude balancing degree, obtained when the electrode finger pitch of the one-terminal-pair surface acoustic wave resonator 406 shown in FIG. 1 is changed based on that of the one-terminal-pair surface acoustic wave resonator 405.
Figure 12:
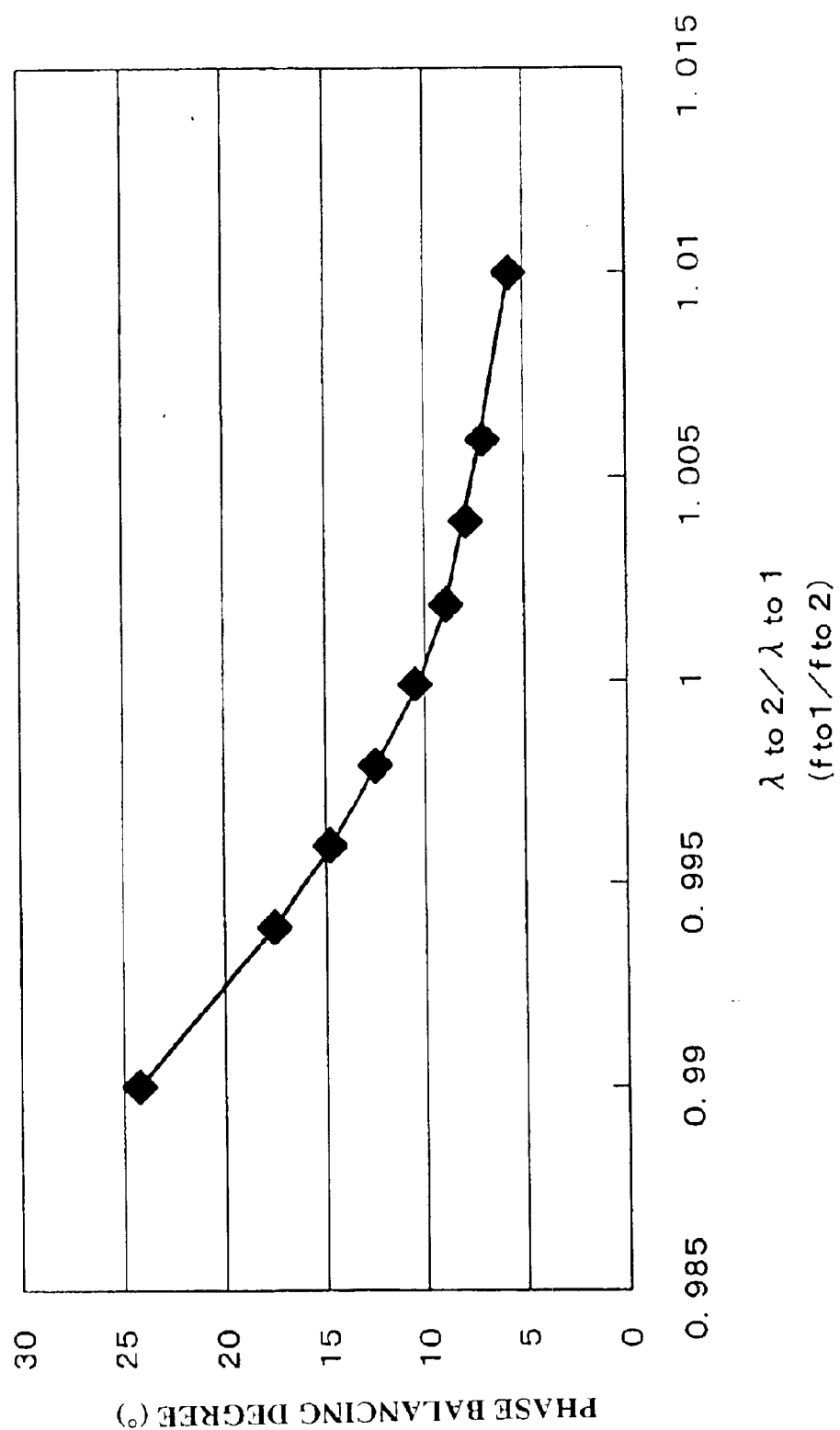
FIG. 12 is a graph showing the change of the amplitude balancing degree, obtained when the electrode finger pitch of the one-terminal-pair surface acoustic wave resonator 406 shown in FIG. 1 is changed based on that of the one-terminal-pair surface acoustic wave resonator 405.

The pitch of the one-terminal-pair surface acoustic wave resonator 406 is changed based on that of the one-terminal-pair surface acoustic wave resonator 405. In this case, FIG. 11 shows the change of the maximum amplitude balancing degree in the applicable frequency range (pass band) of the DCS reception filter. FIG. 12 shows the change of the phase balancing degree. The ratio of the wavelength determined by the pitch of the one-terminal-pair surface acoustic wave resonator 406 based on the wavelength determined by the pitch of the one-terminal-pair surface acoustic wave resonator 405 is plotted as the abscissa in the graph.

Moreover, the frequency ratio fto1/fto2 is plotted as abscissa, in which fto1(fts) represents the frequency determined by the pitch of the one-terminal-pair surface acoustic wave resonator 405 and the sound velocity, and fto2(ftr) represents the frequency determined by the pitch of the one-terminal-pair surface acoustic wave resonator 406 Land the sound velocity. In this case, the amplitude balancing degree and the phase balancing degree present changes similar to those shown in FIGS. 11 and 12, As seen in FIG. 11, the amplitude balancing degree is improved by setting the pitch of the one-terminal-pair surface acoustic wave resonator 406 to be smaller than that of the one-terminal-pair surface acoustic wave resonator 405. As seen in FIG. 12, the phase balancing degree is improved by setting the pitch of the one-terminal-pair surface acoustic wave resonator 406 to be larger than that of the one-terminal-pair surface acoustic wave resonator 405.

According to the second preferred embodiment, both of the amplitude balancing degree and the phase balancing degree are not improved in contrast to the case in which the pitches of the surface acoustic wave elements 401 and 402 are set to be different from each other as described above. However, the second preferred embodiment is effective when one of the amplitude balancing degree and the phase balancing degree is desired to be improved even if the other is deteriorated to some degree. However, when the ratio ($\lambda$to2/$\lambda$to1)of the pitch in the one-terminal-pair surface acoustic wave resonator 406 based on that of the one-terminal-pair surface acoustic wave resonator 405 or the ratio of the frequencies determined by the pitches and the sound velocity becomes about 0.99 or smaller, the balancing degrees are rapidly deteriorated. Thus, desirably, the ratio is about 0.994 or larger.

In the configuration of the second preferred embodiment, the pitches in the one-terminal-pair surface acoustic wave resonators 405 and 406 connected to the balanced terminals 418 and 419 sides, respectively, set to be different from each other. The same advantages can be also obtained when the pitches in the one-terminal-pair surface acoustic wave resonators 403 and 404 connected to the unbalanced terminal 417 side are set to be different from each other.

Figure 13:
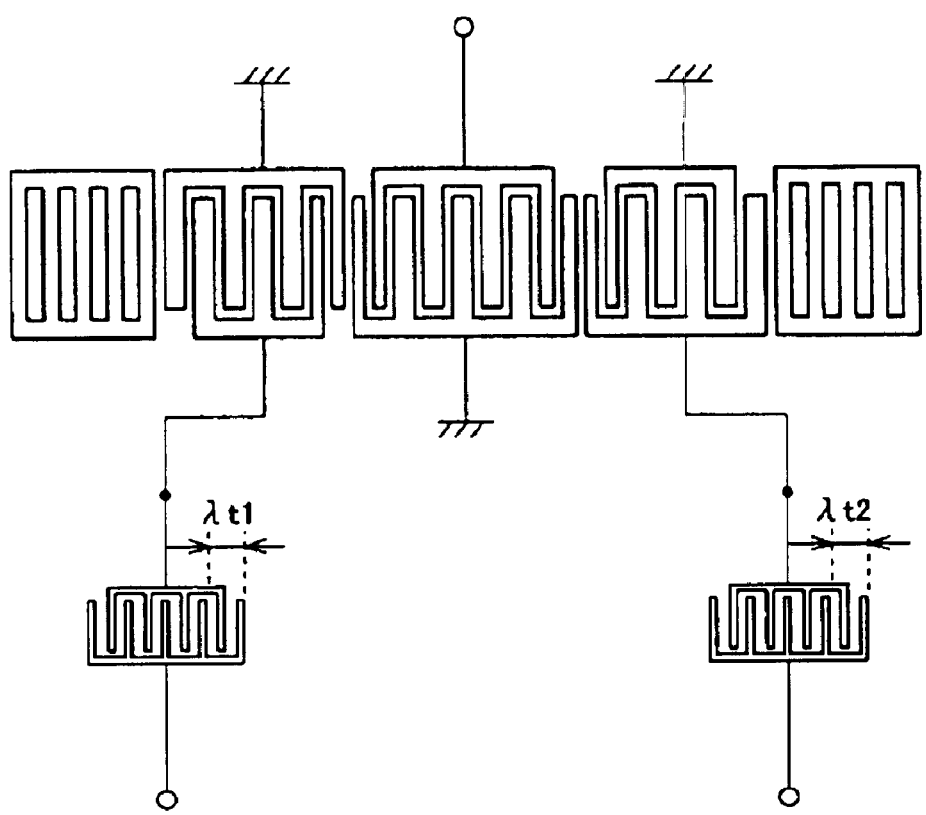
FIG. 13 is a schematic view showing the configuration of a surface acoustic wave device according to a modification of the second preferred embodiment of the present invention.
Figure 14:
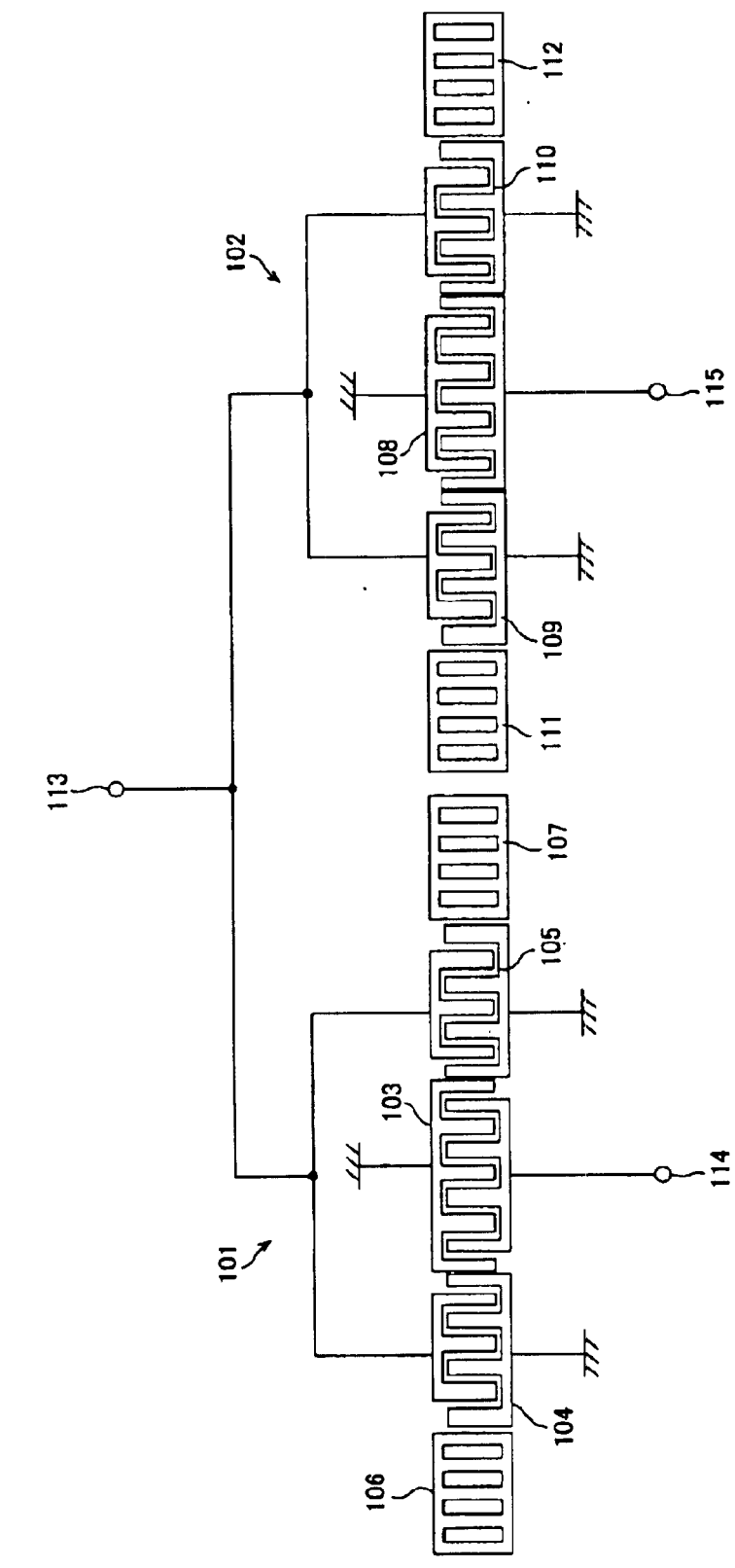
FIG. 14 is a schematic view showing the configuration of a surface acoustic wave device having a balance-unbalance conversion function of which the input and output impedances are different from each other by about four times.
Figure 15:
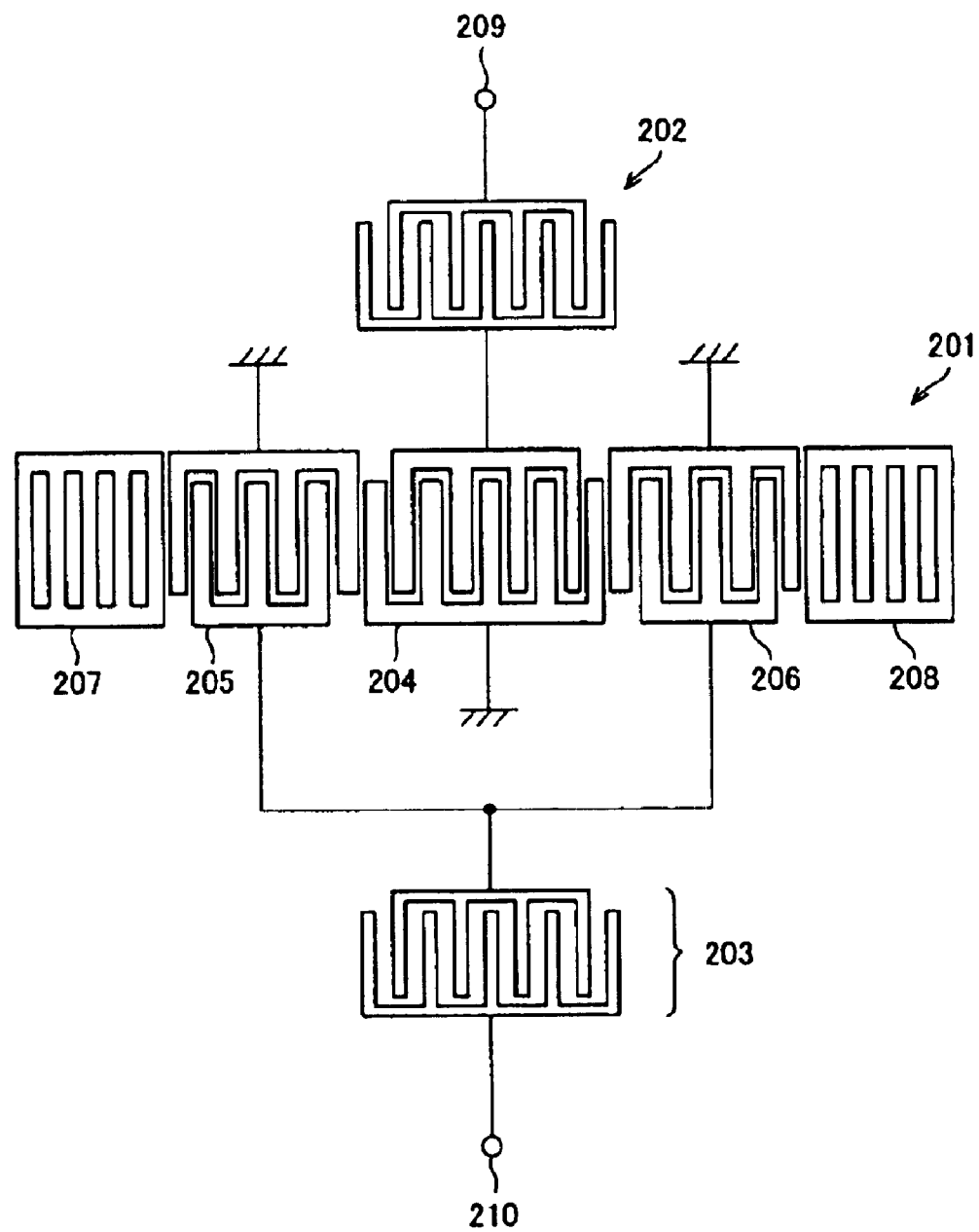
FIG. 15 is a schematic view showing the configuration of a surface acoustic wave device of which the out-of-band characteristic is satisfactory.

As described above, the surface acoustic wave device of the second preferred embodiment includes the two surface acoustic wave elements. The one-terminal-pair surface acoustic wave resonators are connected in series with at least one of the input-output sides of the two surface acoustic wave elements, respectively, and the pitches of the one-terminal-pair surface acoustic wave resonators provided on the right and left sides are set to be different from each other. Thereby, the surface acoustic wave device of which at least one of the amplitude balancing degree and the phase balancing degree caused between the balanced terminals is improved can be provided. FIG. 13 shows a modification of the second preferred embodiment of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device having a balance-unbalance conversion function comprising:

a piezoelectric substrate;

first and second longitudinally coupled resonator type surface acoustic wave elements each having at least three interdigital electrode portions arranged on the piezoelectric substrate along the propagation direction of a surface acoustic wave;

the second surface acoustic wave element having a phase-relationship between the center interdigital electrode portion of the at least three interdigital electrode portions and the interdigital electrode portions sandwiching the center electrode portion which is inverted with respect to the phase-relationship of the first surface acoustic wave element; and an unbalanced terminal provided in which each terminal on one side of the first and second surface acoustic wave elements is electrically connected in parallel to each other, and balanced terminals to which each terminal on the other side of the first and second surface acoustic wave elements is electrically connected in series;

wherein an electrode finger pitch in the interdigital electrode portions of the first acoustic wave element is set to be different from the electrode finger pitch in the interdigital electrode portions of the second acoustic wave element.

2. A surface acoustic wave device according to claim 1, wherein the value of $\lambda ir/\lambda is$ is in the range between about 0.9982 or greater and less than about 1, in which $\lambda is$ represents the electrode finger pitch in the interdigital electrode portions of the first surface acoustic wave element, and $\lambda ir$ r presents the electrode finger pitch in the interdigital electrode portions of the second surface acoustic wave element.

3. A surface acoustic wave device according to claim 1, wherein the value of fis/fir is in the range between about 0.9982 or greater and less than about 1, in which fis represents the frequency caused in the first surface acoustic wave element, and fir represents the frequency caused in the second surface acoustic wave element.

4. A surface acoustic wave device according to claim 1, wherein the piezoelectric substrate is made of one of 40±5° Y-cut X-propagation LiTaO$_3$, 64~72° Y-cut X-propagation LiNb$_3$, and 41° Y-cut X-propagation LiNbO$_3$.

5. A surface acoustic wave device according to claim 1, further comprising reflectors provided on the piezoelectric substrate so as to sandwich the at least three interdigital electrode portions.

6. A surface acoustic wave device having a balance-unbalance conversion function comprising:

a piezoelectric substrate;

first and second longitudinally coupled resonator type surface acoustic wave elements each having a plurality of interdigital electrode portions arranged on the piezoelectric substrate along the propagation direction of a surface acoustic wave;

the second surface acoustic wave element having a phase-relationship between the center interdigital electrode portion of the interdigital electrode portions and the interdigital electrode portions sandwiching the center electrode portion which is inverted with respect to the phase-relationship of the first surface acoustic wave element;

first and second one-terminal-pair surface acoustic wave resonators electrically connected in series to at least one terminal of the first and second surface acoustic wave elements, respectively, whereby first and second surface acoustic wave filters are provided; and an unbalanced terminal provided in which each terminal on one side of the first and second surface acoustic wave filters is electrically connected in parallel to each other, and balanced terminals to which each terminal on the other side of the first and second surface acoustic wave filters is electrically connected in series;

wherein electrode finger pitch of the first one-terminal-pair surface acoustic wave resonator is different from the electrode finger pitch of the second one-terminal-pair surface acoustic wave resonator.

7. A surface acoustic wave device according to claim 6, wherein the value of $\lambda tr/\lambda ts$ is in the range between about 0.994 or greater and less than about 1, in which $\lambda ts$ represents the electrode finger pitch in the interdigital electrode portion of the first one-terminal-pair surface acoustic wave resonator, and $\lambda tr$ represents the electrode finger pitch in the interdigital electrode portion of the second one-terminal-pair surface acoustic wave resonator.

8. A surface acoustic wave device according to claim 6, wherein the value of $fts/\lambda tr$ is in the range between about 0.994 or greater and less than about 1, in which fts represents the frequency of the first one-terminal-pair surface acoustic wave resonator, and ftr represents the frequency of the second one-terminal-pair surface acoustic wave resonator.

9. A surface acoustic wave device according to claim 6, wherein the piezoelectric substrate is made of one of 40±5° Y-cut X-propagation $LiTaO_3$, 64~72° Y-cut X-propagation $LiNbO_3$, and 41° Y-cut X-propagation $LiNbO_3$.

10. A surface acoustic wave device according to claim 6, further comprising reflectors provided on the piezoelectric substrate so as to sandwich the at least three interdigital electrode portions.

* * * * *